United States Patent
O'Hara et al.

(10) Patent No.: US 11,740,185 B2
(45) Date of Patent: Aug. 29, 2023

(54) METHOD FOR DETECTING DEFECTS IN THIN FILM LAYERS

(71) Applicant: MEMSSTAR LIMITED, Livingston Lothian (GB)

(72) Inventors: Anthony O'Hara, Livingston Lothian (GB); Daniel Drysdale, Livingston Lothian (GB)

(73) Assignee: MEMSSTAR LIMITED, Livingston (GB)

( * ) Notice: Subject to any disclaimer, the term of this patent is extended or adjusted under 35 U.S.C. 154(b) by 92 days.

(21) Appl. No.: 17/274,302

(22) PCT Filed: Aug. 29, 2019

(86) PCT No.: PCT/GB2019/052412
§ 371 (c)(1),
(2) Date: Mar. 8, 2021

(87) PCT Pub. No.: WO2020/049273
PCT Pub. Date: Mar. 12, 2020

(65) Prior Publication Data
US 2021/0341393 A1    Nov. 4, 2021

(30) Foreign Application Priority Data
Sep. 7, 2018  (GB) .................. 1814619

(51) Int. Cl.
*G01N 21/84*   (2006.01)
*G01N 21/88*   (2006.01)
(Continued)

(52) U.S. Cl.
CPC ..... *G01N 21/8422* (2013.01); *G01N 21/8851* (2013.01); *G01N 2021/8427* (2013.01);
(Continued)

(58) Field of Classification Search
CPC .......... G01N 21/8422; G01N 21/8851; G01N 2021/8427; G01N 2021/8438; H01L 21/32135; H01L 22/24
See application file for complete search history.

(56) References Cited

U.S. PATENT DOCUMENTS

| 2004/0141640 A1 | 7/2004 | Lee et al. |
| 2008/0020497 A1 | 1/2008 | Miyazaki |

(Continued)

FOREIGN PATENT DOCUMENTS

| FR | 2867309 A1 | 9/2005 | |
| JP | H07283282 A | * 10/1995 | ............. H01L 21/66 |

(Continued)

OTHER PUBLICATIONS

International Search Report, dated Dec. 20, 2019, and Written Opinion, issued in the International application.

(Continued)

*Primary Examiner* — Jamil Ahmed
(74) *Attorney, Agent, or Firm* — Saul Ewing LLP

(57) ABSTRACT

A method of detecting defects in a structure sample comprising a thin film layer and a sacrificial later is disclosed. The method comprises exposing the thin film layer to a vapour phase etchant, obtaining an image of the thin film layer and analysing the image. The vapour phase etchant enhances any defects present in the thin film layer by passing through the defect and etching a cavity within the sacrificial layer. The cavity undercuts the thin film layer resulting in a stress region surrounding the defect. Defects which were not originally detectable may be made detectable after exposure to the vapour phase etchant. A vapour phase etchant has the advantage of being highly mobile such that it can access defects that a liquid phase etchant might not. Furthermore, (Continued)

unlike a liquid phase etchant, a vapour phase etchant can be used to test a sample non-destructively.

31 Claims, 7 Drawing Sheets

(51) Int. Cl.
*H01L 21/3213* (2006.01)
*H01L 21/66* (2006.01)

(52) U.S. Cl.
CPC .......... *G01N 2021/8438* (2013.01); *H01L 21/32135* (2013.01); *H01L 22/24* (2013.01)

(56) References Cited

U.S. PATENT DOCUMENTS

| | | | |
|---|---|---|---|
| 2008/0129988 A1* | 6/2008 | Saito | G01N 21/9501 356/237.2 |
| 2011/0151592 A1 | 6/2011 | Libbert et al. | |
| 2014/0017901 A1* | 1/2014 | O'Hara | H01L 21/30604 438/735 |
| 2015/0017901 A1 | 1/2015 | Pfohl et al. | |
| 2016/0209681 A1* | 7/2016 | Hung | B32B 37/18 |
| 2018/0029883 A1 | 2/2018 | O'Hara | |

FOREIGN PATENT DOCUMENTS

| | | |
|---|---|---|
| JP | H07283282 A | 10/1995 |
| JP | 2005056883 A | 3/2005 |
| KR | 100712721 B1 | 5/2007 |
| WO | 2013055368 A1 | 4/2013 |

OTHER PUBLICATIONS

Hino, T, et al., "Characterization of threading dislocations in GaN epitaxial layers", Applied Physics Letters; vol. 76; Nr. 23, pp. 3421-3423 (Jun. 5, 2000).

* cited by examiner

METHOD FOR DETECTING DEFECTS IN THIN FILM LAYERS

CROSS REFERENCE TO RELATED APPLICATIONS

This application claims the priority of PCT/GB2019/052412, filed on Aug. 29, 2019, which claims priority to GB Application No. GB1814619.1, filed on Sep. 7, 2018, the entire contents of each of which being fully incorporated herein by reference.

The present invention relates to the field of thin film layer processing. More specifically, the present invention concerns the detection of defects in thin film layers.

BACKGROUND TO THE INVENTION

A thin film layer is deposited on to a substrate layer to form a structure. A structure may comprise multiple layers. A layer may, by itself or in conjunction with other layers, be functional. For example, a layer may be conductive or have a desired mechanical property. Such a structure may function as or form part of an electrical device, a solar cell, a flat panel screen for a television or a photo mask, for example. In order to produce a reliable structure, a method of determining whether the thin film layer is defect free is preferred as a means to identify failures in the structure. An example of a defect in a thin film layer is a pinhole. Pinholes cannot be viewed by the human eye or even a microscope, but it is possible to enhance their visibility with the help of additional processing and analysis with metrology. These pinholes are typically smaller than 1 micron in diameter, and might have a diameter on the order of nanometres.

Should a pinhole exist in a given structure this can lead to a failure. In the example of a flat panel screen for use within a television, should a pinhole defect be discovered, this can lead to a failed end product with dead image regions which show up as black dots on the screen when an image is shown. By determining the presence of defects early, this allows manufacturers to remove the panel from production, thus reducing the number of potential field failures and manufacturing costs. Similarly, in solar cells, early identification of defects allows for cells with a high likelihood of failure to be removed from further production steps and, as a result, minimise wasted costs. These failures would cause a significant drop in energy conversion from solar to electrical due to the failed regions not absorbing sunlight. In the case of electrical devices, due to the nature of manufacture in which multiple devices could be manufactured in a single process run, identification of defects again allows for electrical devices with a high likelihood of failure to be removed from final manufacturing stages and sending out failed devices. These failure methods are numerous and varied, but their presence can cause significant levels of lost revenue.

The primary issue with pinholes is that the required minimum detectable pinhole size is continually decreasing yet the current detection methods are beginning to encounter limits. Current detection methods typically utilise an etching solution in which a test sample of a structure is submerged (in the etching solution). One method among many etching solutions, is the use of hydrofluoric acid for the enhancement of defects in thin films deposited on a substrate. The etching solutions then highlight regions on the sample where the device has developed a failure. A major issue with the current detection methods is the global exposure to this etching solution, typically in an acid form, which may result in damage to otherwise viable devices elsewhere on the same test sample. Pinhole detection processes rely on the wet etchant being sufficiently mobile such that the etchant can flow through the pinhole and cause a change in a localised region of the underlying layer to indicate the location of the defect. In practice, the minimum detectable pinhole size is limited by the wet etchant mobility and this minimum detectable pinhole size may not be sufficient for detecting all potential failure inducing defects in a thin film layer. Furthermore, as electronic devices continue to shrink in dimension, the pinhole defects capable of resulting in a device failure are also become smaller whilst increasing tolerances are required in the manufacture of the electronic devices.

This also means that each type of product or device has its own "critical pinhole" threshold which is considered large enough to result in a high likelihood of failure. Existing wet etching processes utilised in defect detection do not allow for customisation or control of the process. Furthermore, due to the destructive nature of existing wet etching processes the test sample can only be tested using one method.

It is an object of an aspect of the present invention to provide a method of detecting defects in thin film layers that obviates or at least mitigates one or more of the aforesaid disadvantages of the methods known in the art.

SUMMARY OF THE INVENTION

According to a first aspect of the present invention there is provided a method of detecting one or more defects in a structure sample comprising a thin film layer and a sacrificial layer, the method comprising:
  exposing the thin film layer to a vapour phase etchant;
  obtaining an image of the thin film layer; and
  analysing the image.

Advantageously, a vapour phase etchant has a high mobility in comparison to a liquid phase etchant. As such, a vapour phase etchant may access far smaller defects in a thin film layer. When such defects exist, the vapour phase etchant etches a local region of an adjacent sacrificial layer resulting in a stress region in the thin film layer.

Preferably, exposing the thin film layer to a vapour phase etchant enhances any defects present in the thin film layer.

Preferably, exposing the thin film layer to a vapour phase etchant creates a cavity in the sacrificial layer below the defect in the film thin layer.

Preferably, exposing the thin film layer to a vapour phase etchant creates a stress region about the defect in the thin film layer.

Preferably, the method further comprises optimising one or more test parameters.

The advantage of being able to optimise the test parameters when exposing a thin film layer to a vapour phase etchant is that this may be used to define the defect sizes that can be detected.

Preferably, the one or more test parameters comprise one or any combination of: temperature, pressure; etchant vapour density; material composition of the sacrificial layer; the duration of exposure to the vapour phase etchant; the resolution of the image of the thin film layer; and a process catalyst if required, resulting in additional parameters of catalyst vapour density and catalyst species.

Most preferably, the vapour phase etchant etches the sacrificial layer but not the thin film layer. The method may therefore comprise selecting or providing a vapour phase etchant which etches the sacrificial layer but not the thin film layer.

Preferably, the vapour phase etchant comprises hydrogen fluoride. The sacrificial layer may comprise silicon dioxide. Preferably, the pressure within a test chamber is typically between vacuum, 0 Pa, and atmospheric pressure, ~100,000 Pa and, most preferably, between ~67 Pa to 6,700 Pa (~0.5 to 50 Torr). Preferably, the temperature within the test chamber is typically between ~5 degrees Celsius to 100 degrees Celsius and most preferably, between ~5 degrees Celsius to 45 degrees Celsius. Optionally, water or alcohol may be a catalyst.

Alternatively, the vapour phase etchant may comprise xenon difluoride. The sacrificial layer may comprise germanium, molybdenum and or a silicon type material such as single crystal silicon, polycrystalline silicon and or amorphous silicon. Preferably, the pressure within the test chamber is between ~67 Pa to 6,700 Pa (~0.5 to 50 Torr). Preferably, the temperature of the test chamber is between ~15 degrees Celsius to 100 degrees Celsius.

Preferably, obtaining an image of the thin film layer comprises obtaining an image of a first surface of the thin film layer. The first surface is preferably opposite the sacrificial layer.

Preferably, obtaining an image of the thin film layer comprises utilising an imaging instrument such as: an optical microscope; a scanning electron microscope; and or an atomic force microscope.

Most preferably, the instrument resolution of the imaging instrument is factored into the optimisation of the one or more test parameters.

Preferably, analysing the image comprises identifying any defects within the image of the first surface of the thin film layer.

Most preferably, analysing the image comprises identifying any stress regions within the image of the first surface of the thin film layer.

Optionally, analysing the image may further comprise quantifying the size of any defects and or the size of any stress regions.

Most preferably, analysing the image further comprises determining whether the size of a defect and or the size of a stress region is equal to or exceeds a critical or threshold size; or is smaller than a critical or threshold size.

Optionally, analysing the image may be performed by a computer program.

Optionally, analysing the image may further comprise performing image enhancement techniques.

Optionally, analysing the image may be automated.

Optionally, the method comprises obtaining two or more images of the thin film layer.

Each image may be obtained using the same imaging instrument or alternatively using two or more imaging instruments, which may be of different quality, resolution and or type.

Optionally, the method comprises obtaining one or more images of the thin film layer before exposure to the vapour-phase etchant and one or more images after exposure to the vapour-phase etchant.

Optionally, the method further comprises analysing and comparing multiple images of the thin film layer. Utilising multiple images obtained by one or more imaging instruments of different quality, resolution and or type may improve the accuracy of identifying defects by minimising the combined measurement uncertainty and may benefit from different dynamic ranges of different imaging instruments. Comparing and identifying the differences between images obtained before and after exposure to the vapour-phase etchant may more effectively identify defects than inspection of a single image obtained after exposure to the vapour-phase etchant. Such an analysis may be automated and or performed algorithmically such as by software.

Most preferably, the method of analysing the image is factored into the optimisation of the one or more test parameters.

According to a second aspect of the present invention there is provided a testing system for detecting defects in accordance with the method of the first aspect, the testing system comprising a vapour phase etchant delivery system and a test chamber adapted or configured to receive a structure sample.

Preferably, the vapour phase etchant delivery system comprises one or more mass flow controllers and or liquid flow meters. The mass flow controllers and liquid flow meters control the amount of vapour etchant, catalyst and or carrier gas passing through the test chamber. Preferably, the testing system comprises a pump in fluid communication with the vapour phase etchant delivery system via the test chamber.

Preferably, the vapour phase etchant delivery system comprises one or any combination of: a hydrogen fluoride source, a xenon difluoride source, a nitrogen source and catalyst source.

Preferably, the test chamber comprises a pedestal. The structure sample may be located on the pedestal.

Preferably, the test chamber comprises one or more temperature-controlled heater cartridges. The one or more temperature-controlled heater cartridges may actively control and maintain the temperature within the chamber.

Preferably, the pedestal comprises a pedestal temperature controller. The pedestal temperature controller may actively control and maintain the temperature of the pedestal.

Preferably, the test chamber comprises a pressure gauge. The combination of the pump, a throttle valve connected to the pump, the mass flow controllers and the pressure gauge may control the pressure and or vapour etchant density within the test chamber.

Embodiments of the second aspect of the invention may comprise features to implement the preferred or optional features of the first aspect of the invention or vice versa.

According to a third aspect of the present invention there is provided a quality control method for the manufacture of structure samples, the method comprising detecting defects in the sample according to the method of the first aspect and discarding or not discarding the sample accordingly.

Discarding or not discarding the sample may comprise:
 discarding the structure sample if the size of a defect and or the size of a stress region is equal to or exceeds a critical or threshold; and or
 not discarding the structure sample if the size of a defect and or the size of a stress region is smaller than a critical or threshold size.

Embodiments of the third aspect of the invention may comprise features to implement the preferred or optional features of the first and or second aspects of the invention or vice versa.

According to a fourth aspect of the present invention there is provided a vapour phase etching system adapted to detect defects in a structure sample in accordance with the method of the first aspect.

Embodiments of the fourth aspect of the invention may comprise features to implement the preferred or optional features of the first, second and or third aspects of the invention or vice versa.

BRIEF DESCRIPTION OF DRAWINGS

There will now be described, by way of example only, various embodiments of the invention with reference to the drawings, of which.

Figure 1:
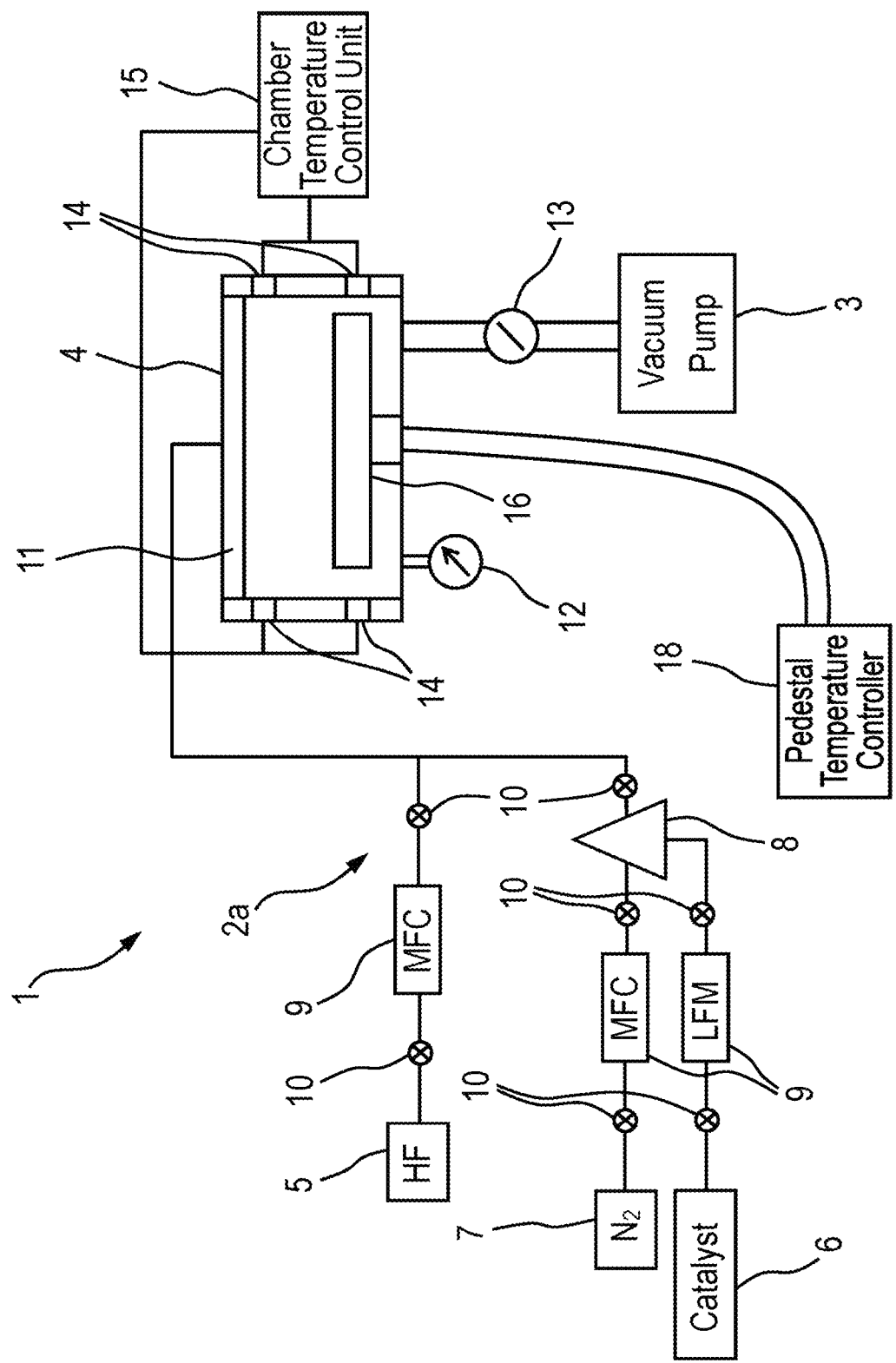
FIG. 1 presents a schematic representation of a testing system in accordance with an embodiment of the present invention where the etchant is hydrogen fluoride.

In the description which follows, like parts are marked throughout the specification and drawings with the same reference numerals. The drawings are not necessarily to scale and the proportions of certain parts have been exaggerated to better illustrate details and features of embodiments of the invention.

DETAILED DESCRIPTION OF THE PREFERRED EMBODIMENTS

An explanation of the present invention will now be described with reference to FIGS. 1 to 7.

According to a first embodiment, FIG. 1 depicts a hydrogen fluoride (HF) vapour-based testing system 1 comprising a gas delivery system 2a and a vacuum pump 3 in fluid communication via a test chamber 4.

The gas delivery system 2a comprises an HF vapour source 5, a catalyst source 6 which takes the form of a water or alcohol source, a nitrogen gas source 7 and a vaporiser 8. Catalyst vapour for use within the test chamber 4 is produced by connecting the catalyst source 6 to the vaporiser 8. The nitrogen gas source 7 is a standard element of the vaporiser 8, and acts as a carrier gas to assist in transporting the catalyst vapour to the test chamber 4. When utilised, the catalyst vapour is employed during the HF vapour etch. Mass Flow Controllers or Liquid Flow Meters (MFC/LFM) 9 and pneumatic valves 10 are preferably provided within each supply line of the gas delivery system 2a to regulate the gas flow and direction of HF vapour, catalyst (water or alcohol) vapour and nitrogen gas to the test chamber 4. The gas delivery system 2a is connected to a showerhead 11 which distributes the HF vapour, catalyst (water or alcohol) vapour and nitrogen gas within the test chamber 4.

A pressure gauge (baratron) 12 is employed to monitor the pressure within the test chamber 4. The pump rate of the vacuum pump 3 and the flow rate of the MFC/LFM 9 can be controlled, for example by adjusting a pump control valve 13, to maintain a set operating pressure within the test chamber 4.

The temperature of the test chamber 4 is controlled by four temperature-controlled heater cartridges 14. These heater cartridges 14 have a build in thermocouple, controlled by an external chamber temperature control unit 15.

The test chamber 4 further comprises a pedestal 16 upon which a structure sample 17 to be tested is located. The temperature of the pedestal 16 is controlled by a pedestal temperature controller 18. The pedestal temperature controller 18 provides a means for setting and maintaining an operating temperature of the pedestal 16. More specifically, the pedestal temperature controller 18 may take the form of a heat exchanger connected to the pedestal by insulated piping. The insulated piping contains a 50:50 mix of de-ionised water and ethylene glycol. The heat exchanger is located externally to the test chamber 4 and has an internal thermocouple which then controls the temperature of the liquid it outputs. This then cools (or heats) the pedestal 16.

Figure 2:
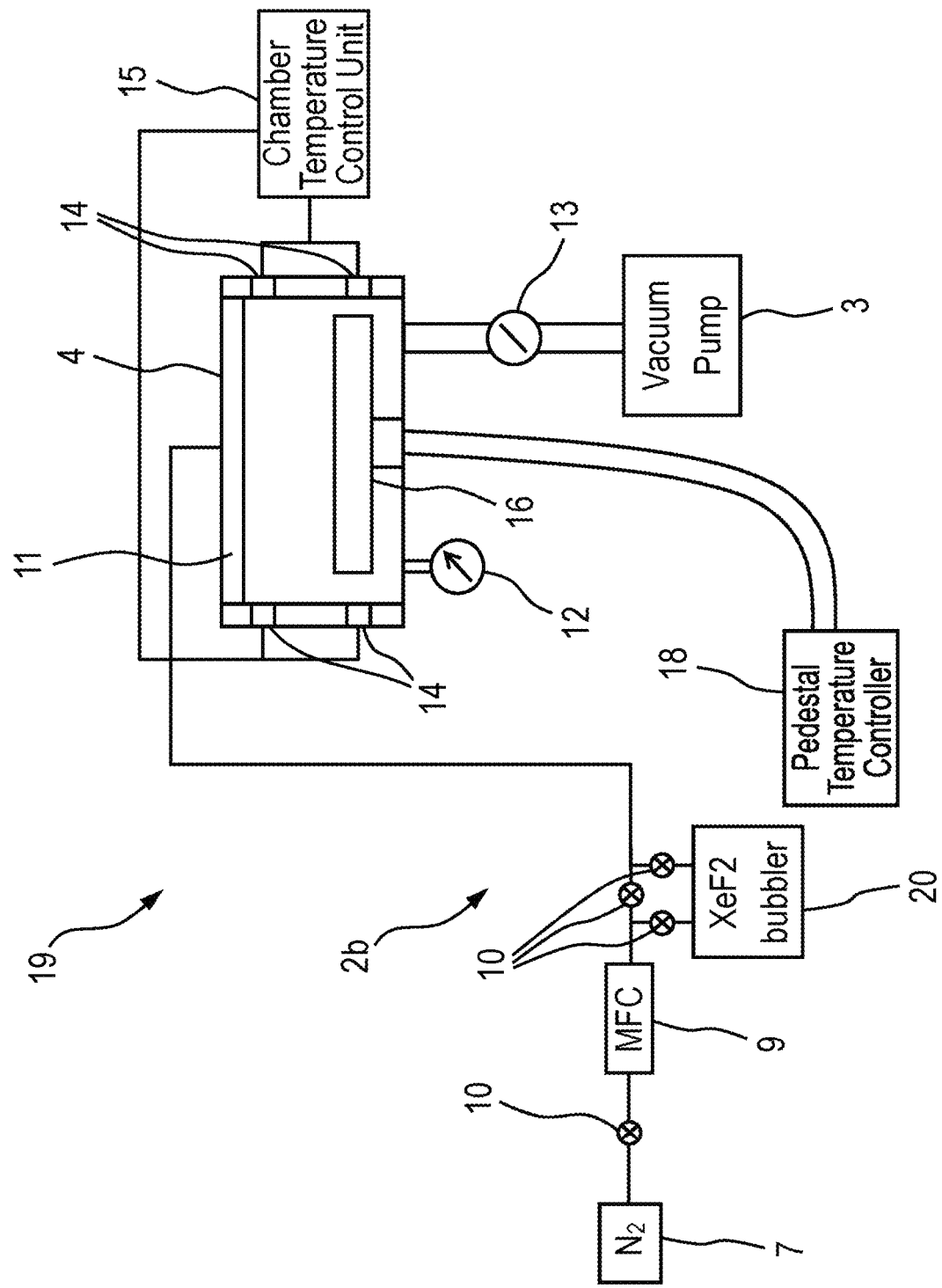
FIG. 2 presents a schematic representation of a testing system in accordance with alternative embodiment of the present invention where the etchant if xenon difluoride.

According to a second embodiment, FIG. 2 depicts a xenon difluoride ($XeF_2$) vapour-based testing system 19. This $XeF_2$ vapour-based testing system 19 comprises the same and or equivalent features to the HF vapour-based testing system 1 depicted in FIG. 1. In contrast to the HF vapour-based testing system 1, the $XeF_2$ vapour-based testing system 19 comprises a different gas delivery system 2b. The gas delivery system 2b comprises a $XeF_2$ bubbler 20 and a nitrogen gas source 7. The $XeF_2$ bubbler 20 comprises $XeF_2$ crystals. As nitrogen gas passes over the $XeF_2$ crystals, $XeF_2$ sublimes and is carried by the nitrogen gas into the test chamber 4. MFC 9 controls: the supply of nitrogen gas to the $XeF_2$ bubbler 20; the supply of nitrogen gas to the test chamber 4; and the supply of nitrogen gas with $XeF_2$ vapour to the test chamber 4. As above, the pump rate of the vacuum pump 3 and or the MFC 9 can be controlled, for example by adjusting the pump control valve 13, to maintain a set operating pressure within the test chamber 4. As noted above, other features and capabilities are as described in relation to the first embodiment.

It will be noted that testing systems 1 and 19 share features in common with HF and $XeF_2$ vapour-based etching systems, respectively; indeed, it is envisaged that such systems (and indeed other functionally equivalent etching systems) might be adapted, configured or otherwise employed as testing systems for implementing the methods of the present invention.

Figure 3:
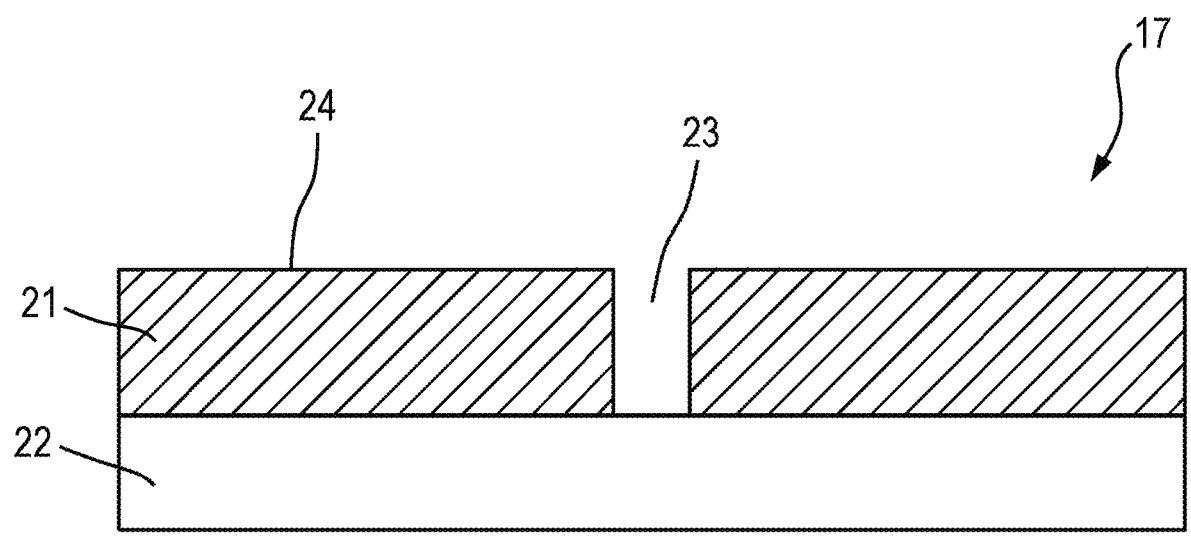
FIG. 3 presents a schematic cross sectional representation of a structure sample before exposure to a vapour phase etchant.

FIG. 3 presents a cross sectional schematic representation of a sample structure 17 which comprises a thin film layer 21, which is the layer of interest, deposited upon a sacrificial layer or substrate 22. The thin film layer 21 comprises a pinhole defect 23 and the pinhole defect 23 extends through the thin film layer 21, from a first surface 24 to the sacrificial layer 22.

According to the present invention, to detect the presence of the pinhole defect 19 in the thin film layer 17, the thin film layer 17 is exposed to a vapour phase etchant, for example by placing the structure sample 17 on the pedestal 12 in the test chamber 4 of either of testing systems 1 or 19, or indeed an appropriate or functional equivalent as suggested above.

The skilled person will appreciate that if the sample structure 17 comprises an $SiO_2$ sacrificial layer 22 it is appropriate to employ an HF vapour-phase etchant, for example using the HF vapour-based testing system 1 described above.

Typical but non-limiting testing parameters when operating the HF vapour-based testing system 1 may be as follows: the pressure within the test chamber 4 may be between vacuum, 0 Pa, and atmospheric pressure, ~67 Pa to 6,700 Pa (~0.5 to 50 Torr); the temperature within the test chamber 4 may be between ~5 degrees Celsius to 100 degrees Celsius and more specifically, between ~5 degrees Celsius to 45 degrees Celsius; and an (optional) catalyst may be water or an alcohol. As an alternative to the gas delivery system 2a of the HF vapour-based testing system 1, an equivalent method for exposure to an HF vapour phase etchant can be performed by suspending a structure sample 17 over a liquid HF bath and utilising the natural vapours.

Likewise, the skilled person will appreciate that if the sacrificial layer 22 of the sample structure 17 comprises a silicon type material such as single crystal silicon, polycrystalline silicon and or amorphous silicon, it is appropriate to employ an $XeF_2$ vapour etchant, for example using the XeF2 vapour based testing system 19 described above. Such an etchant would also be suitable if the sacrificial layer 22 comprised germanium or molybdenum.

Typical but non-limiting testing parameters when operating the $XeF_2$ vapour-based testing system 19 may be as follows: the pressure within the test chamber 4 may be between ~67 Pa to 6,700 Pa (~0.5 to 50 Torr); the temperature of the test chamber 4 may be between ~15 degrees Celsius to 45 degrees Celsius; noting that a catalyst is not required.

As suggested above, it is envisaged that the present invention can be implemented using any vapour phase etchant, provided the vapour phase etchant is selected to etch the sacrificial layer 19 but not the thin film layer 21.

Figure 4:
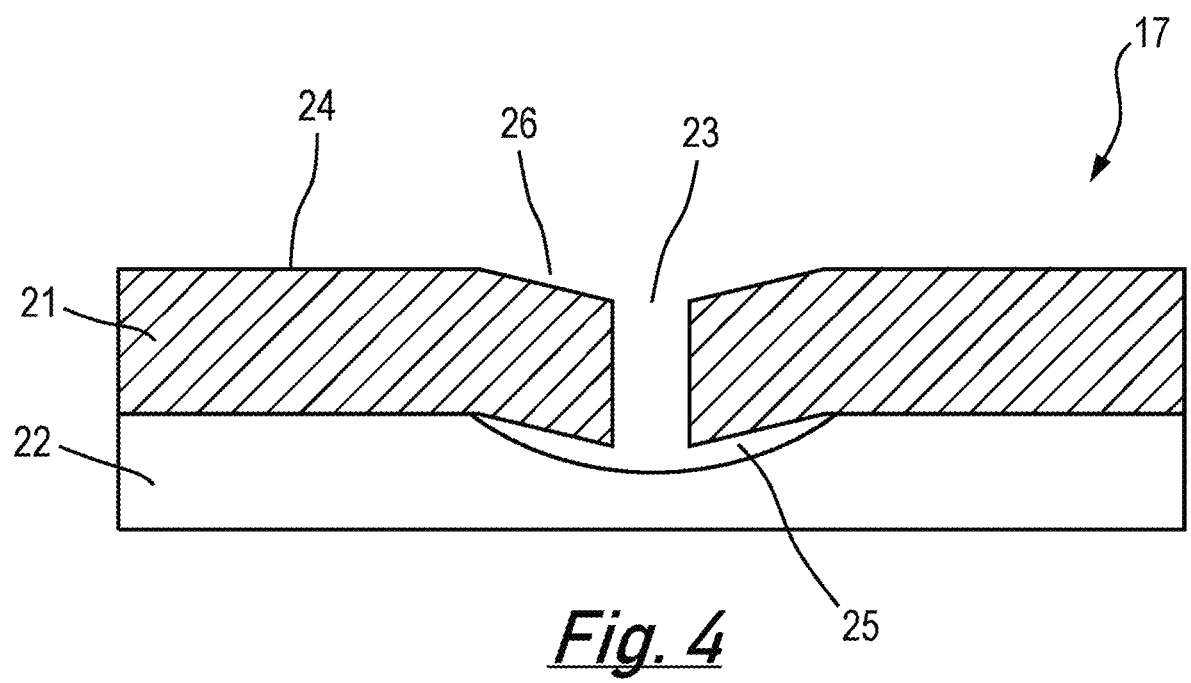
FIG. 4 presents a schematic cross sectional representation of a structure sample after exposure to a vapour phase etchant.

FIG. 4 shows a cross sectional schematic representation of the sample structure 17 after exposure to a vapour phase etchant, clearly highlighting the effectiveness of the present invention as a method for detecting defects. A vapour phase etchant (e.g. HF, $XeF_2$) is significantly more mobile than a liquid phase etchant and the Applicant has discovered that this increased mobility is such that the etchant can access smaller defect regions than a liquid etchant such as the pinhole defect 23 illustrated in FIG. 3. The vapour etchant has access to a localised region of the sacrificial layer 22 through the pinhole defect 23. As such, and as shown in FIG. 4, the vapour phase etchant has etched a cavity 25 in the sacrificial layer 22 directly below the pinhole defect 23.

If the diameter of the cavity is greater than the diameter of the pinhole defect 23 such that the cavity 25 undercuts the region of the thin film layer 21 surrounding the pinhole defect 23. This region of the thin film layer 21 collapses into the cavity 25 resulting in a stress region 26 in the first surface 24 of the thin film layer 21 directly above the cavity 25. Whilst the pinhole defect 23 itself may not be detectable, the stress region 26 is typically detectable by using, for example, optical microscopy metrology (i.e. it may be detectable by optical inspection), scanning electron microscopes (SEM) or even atomic force microscopy (AFM).

Figure 5:
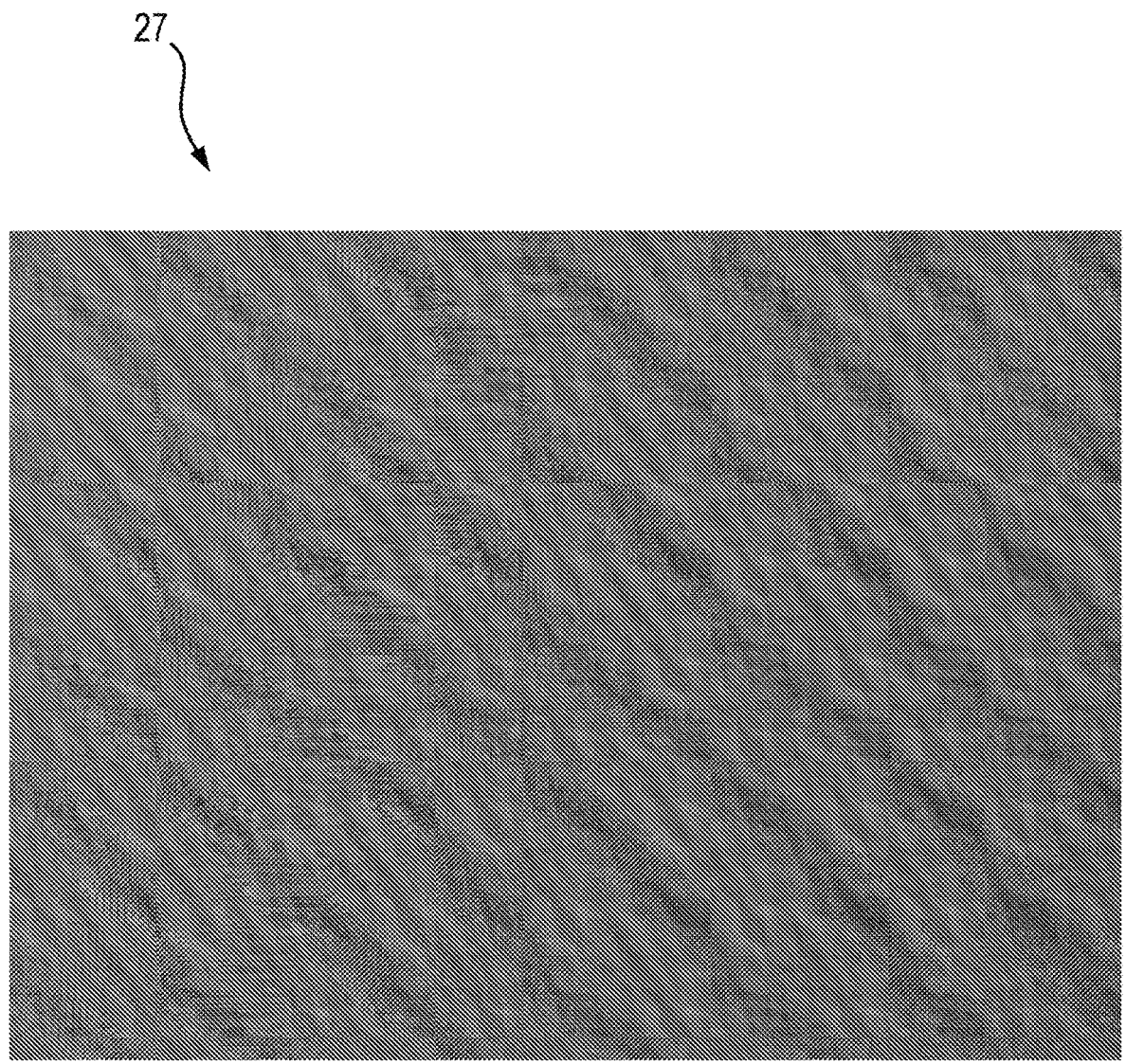
FIG. 5 is an SEM image of a thin film layer sample before exposure to a vapour phase etchant.

FIG. 5 shows a scanning electron microscope image 27 of a 1.28 mm wide region of the first surface 24 of a thin film layer 21 before exposure to a vapour phase etchant. This image 27 does not show any visible pinhole defects. Image 27 has a magnification of 160×.

Figure 6:
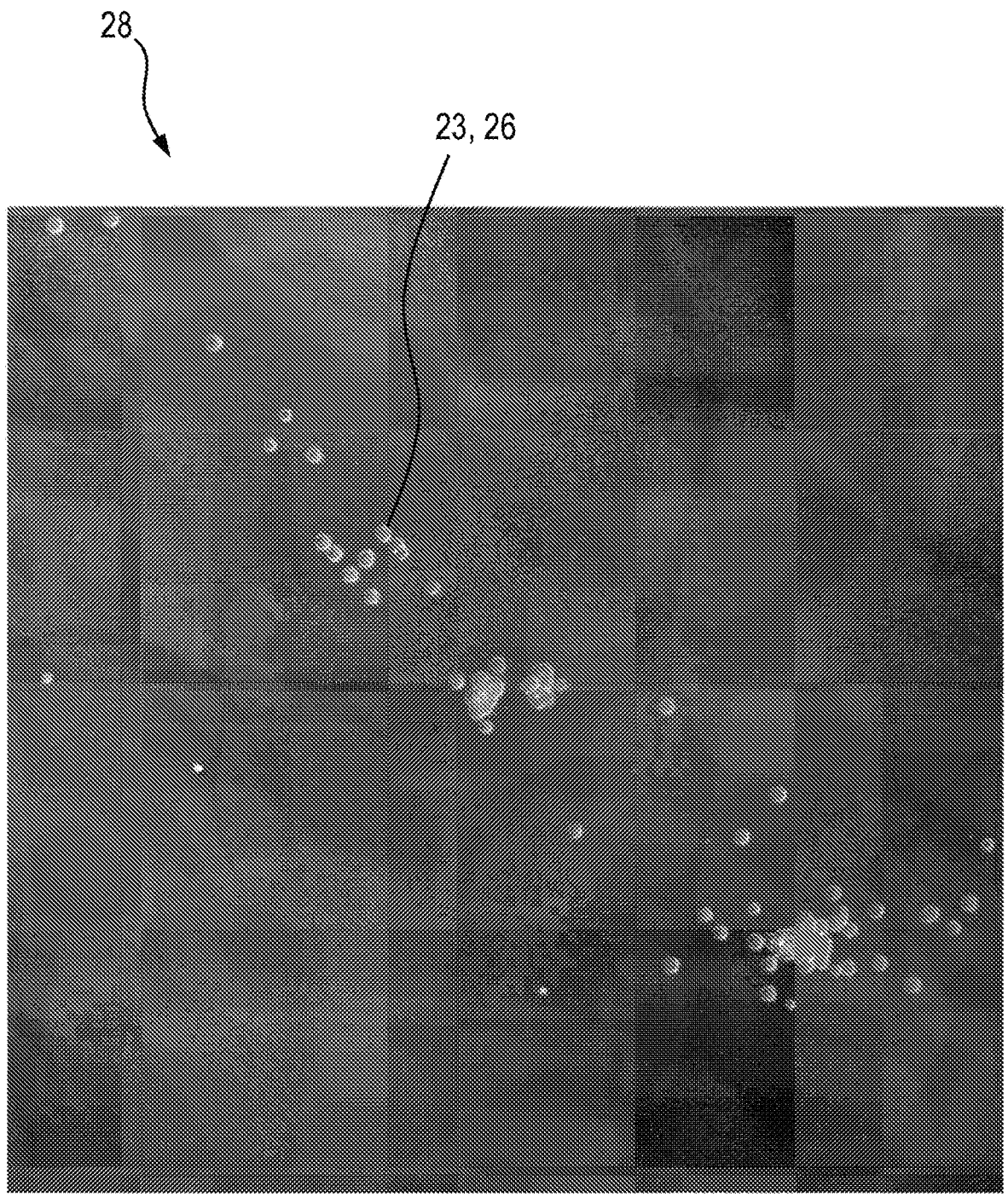
FIG. 6 is an SEM image of a thin film layer after exposure to a vapour phase etchant.

FIG. 6 shows a scanning electron microscope image 28 of a 1.30 mm square region of the first surface 24 of a thin film layer 21 after exposure to a vapour phase etchant in accordance with the present invention. This image 28 shows numerous pinhole defects 23 with enhanced and now visible diameters in the region of 5 to 20 µm. Image 28 has a magnification of 163×.

Figure 7:
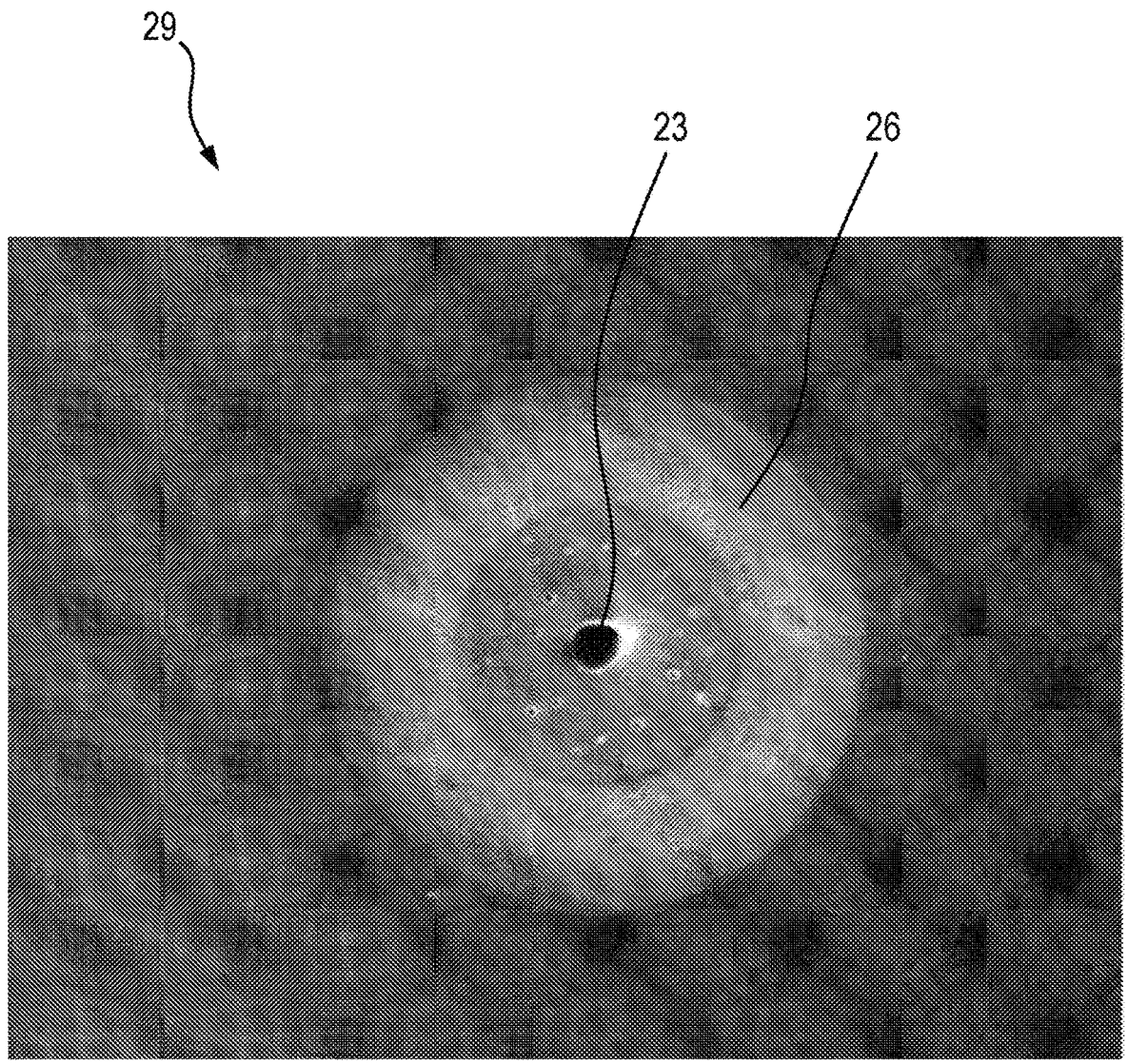
FIG. 7 is an SEM image of a thin film layer after exposure to a vapour phase etchant, at a higher magnification than the SEM image of FIG. 6.

FIG. 7 shows a scanning electron microscope image 29 of a 0.391 mm wide region of a thin film layer 21 after exposure to a vapour phase etchant in accordance with the present invention (in this case HF). This image 29 shows a pinhole defect 23 surrounded by a stress region 26; the stress region diameter (which may be termed an enhanced diameter of the pinhole defect) is of the order 10 times greater than the pinhole diameter which makes it far easier to detect than would otherwise have been the case. Image 29 has a magnification of 710×.

As shown in FIG. 6, a structure sample 17 can comprise pinhole defects 23 of varying diameter. A critical pinhole diameter may be used to quantify a threshold above which the viability of a structure sample is compromised. In other words, pinhole defects with a diameter above a critical pinhole diameter will result in the failure of the structure sample during subsequent stages of manufacturing or during operation of a completed structure. Conversely, pinhole defects below a critical pinhole diameter will not result in the failure of the structure sample.

However, there is no absolute value for the critical pinhole size as this parameter is dependent on factors such as the intended application of the structure sample, the composition of the thin film layer and the manufacturing process(es). As intimated in the background section above, critical pinhole sizes are decreasing as devices become smaller and more complex.

For example, for some applications, it may be important to the manufacturing process to detect relatively large pinhole defects with a diameter of, say, 50 µm or greater. It is noted that these relatively large pinhole defects are likely to be detectable (i.e. visible) without exposure to a vapour phase etchant. In this example, the structure sample may still comprise pinhole defects with a diameter below 50 µm but these defects 23 might not be considered to significantly contribute towards the failure of the structure sample and as such might be considered to be within manufacturing tolerances. In such cases, visual inspection (using a microscope or camera) may be sufficient to determine whether a sample passes or fails.

In other applications, it may be important to detect pinhole defects with a size or diameter of the order of tens of microns or less, and even submicron in some applications. These pinhole defects are generally not detectable without an enhancement process and as such the present invention allows their location to be determined.

The testing process can be optimised or tailored by adjusting parameters such as: the test chamber 4 temperature or pedestal temperature, the test chamber 4 pressure, pump rate, etchant vapour density in the test chamber 4, a process catalyst (if required), resulting in additional parameters of catalyst vapour density and catalyst species, the material composition of the sacrificial layer, and or duration of exposure to the vapour phase etchant. For example, the testing process may be adapted to emphasise and thereby detect (or render detectable) relatively smaller pinhole defects by increasing the duration of exposure to a vapour phase etchant to increase the size (depth and diameter) of the cavity so produced, which in turn increases the contrast or diameter of the stress region 26 (or enhanced pinhole diameter) on the thin film layer 21.

It is therefore envisaged that the testing process may comprise optimising or tailoring the test parameters so as to detectably emphasise only defects above a critical size. In other words, and summarising the above, test parameters can be optimised or tailored so that defects below a critical size are not detectable (perhaps because there is no or insignificant under-cut etching of the sacrificial layer) in a subsequent imaging, inspection or analysis.

Another factor to consider when optimising the test parameters of the testing systems is that the ability to detect pinholes defects is dependent on the imaging instrument (and or method). For example, the resolution of an imaging instrument may vary due to the quality of the instrument or even the type of imaging technique. Consequently, if say a relatively high-resolution optical microscopy instrument is used to take an image of the thin film layer, then the vapour phase etchant may not have to as significantly enhance or emphasise the pinhole defects for them to be detectable as might be the case with a lower-resolution instrument.

A further additional factor to consider when optimising the test parameters of the testing systems is that more advanced analysis of the image taken by the imaging instrument may minimise the required enhancement of the pinhole defects for them to be detectable.

Analysis of the sample after exposure to the vapour phase etchant may comprise, for example, visual inspection. For example, the thin film layer may be viewed under an optical microscope or a scanning electron microscope or an atomic force microscope or even without an imaging instrument to visually identify defects and or stress regions. This might involve some degree of image enhancement to exaggerate defects in the images so obtained. Alternatively, the stress regions may be identified using software such as a defect detection algorithm. When utilising software, the analysis process could be automated.

An alternative or complementary analysis approach may be to obtain an image of the sample before exposure to the vapour phase etchant and obtain an image of the sample after exposure to the vapour phase etchant and comparing these images visually or algorithmically. Identifying differences between these images may identify defects more easily than simply inspecting a single image of the sample after exposure to the vapour phase etchant. It is also envisaged that a sequence of images could be obtained during exposure to the vapour phase etchant to monitor the development of any stress regions.

A further alternative or complementary analysis approach may be to obtain multiple images of the thin film layer using different imaging instruments. The imaging instruments may vary in quality and even the imaging technique. Comparison of multiple images may identify defects more efficiently than considering one image. Furthermore, this analysis approach may benefit from utilising different imaging instruments with different dynamic ranges. For example, a scanning electron microscope may be able to better resolve submicron defects than an optical microscopy. On the other hand, an optical microscope may be quicker at imaging macroscopic defects in comparison to an scanning electron microscope.

For the avoidance of doubt, the present invention is applicable to detecting defects other than pinhole defects, which are just one example of the kinds of defects which might be present in a structure sample. Accordingly, where features or benefits are described in the context of pinhole defects these will be understood to be appropriate for and applicable to other kinds of defects such as cracks or cavities or the like.

There are numerous advantages to utilising a vapour phase etchant, to detect defects such as pinhole defects, that the applicant has realised. First, the highly mobile gas molecules of a vapour phase etchant can access significantly smaller defects than would be possible by utilising methods currently known in the art. Second, a vapour phase etchant is more selective in that only the sacrificial layer below a defect is etched. The thin film layer and unexposed regions of the sacrificial layer are undamaged. As such, the exposure to a vapour phase etchant is non-destructive when there are no defects, or at least none above a critical or threshold defect size within the thin film layer. Structure samples which fail the defect analysis can be removed, while samples which pass the defect analysis are still fit for purpose, resulting in an increased yield and throughput for devices with a reduction in waste product. Another advantage is the flexibility and adaptability of the use of vapour-phase etchants. The test parameters can be changed such that defects of varying sizes can be detected. Factors that can be incorporated into the optimisation of the test parameters include: the application of the structure sample, material composition of the thin film layer, the manufacturing process(es) and the imaging technique and or instrument used to detect the defects.

As mentioned in the background to the invention above, existing testing methods are destructive, whereas the testing method of the present invention is non-destructive provided the samples being tested are free of defects above a critical defect size.

A method of detecting defects in a structure sample comprising a thin film layer and a sacrificial later is disclosed. The method comprises exposing the thin film layer to a vapour phase etchant, obtaining an image of the thin film layer and analysing the image. The vapour phase etchant enhances any defects present in the thin film layer by passing through the defect and etching a cavity within the sacrificial layer. The cavity undercuts the thin film layer resulting in a stress region surrounding the defect. Defects which were not originally detectable may be made detectable after exposure to the vapour phase etchant. A vapour phase etchant has the advantage of being highly mobile such that it can access defects that a liquid phase etchant might not. Furthermore, unlike a liquid phase etchant, a vapour phase etchant can be used to test a sample non-destructively.

Throughout the specification, unless the context demands otherwise, the terms "comprise" or "include", or variations such as "comprises" or "comprising", "includes" or "including" will be understood to imply the inclusion of a stated integer or group of integers, but not the exclusion of any other integer or group of integers. Furthermore, unless the context demands otherwise, the term "or" will be interpreted as being inclusive not exclusive.

The foregoing description of the invention has been presented for purposes of illustration and description and is not intended to be exhaustive or to limit the invention to the precise form disclosed. The described embodiments were chosen and described in order to best explain the principles of the invention and its practical application to thereby enable others skilled in the art to best utilise the invention in various embodiments and with various modifications as are suited to the particular use contemplated. Therefore, further modifications or improvements may be incorporated without departing from the scope of the invention as defined by the appended claims.

The invention claimed is:

1. A method of detecting one or more defects in a structure sample comprising a thin film layer on a sacrificial layer, the method comprising:
   exposing the thin film layer to a vapour phase etchant to create a cavity in the sacrificial layer below a defect in the film thin layer;
   obtaining an image of the thin film layer; and
   analysing the image;
   wherein the vapour phase etchant is selected to etch the sacrificial layer but not the thin film layer.

2. The method of detecting one or more defects in a structure sample as claimed in claim 1 wherein, exposing the thin film layer to a vapour phase etchant enhances any defects present in the thin film layer.

3. The method of detecting one or more defects in a structure sample as claimed in claim 1, wherein the vapour phase etchant is selected to etch the sacrificial layer but not the thin film layer.

4. The method of detecting one or more defects in a structure sample as claimed claim 1 wherein, exposing the thin film layer to a vapour phase etchant creates a stress region about the defect in the thin film layer.

5. The method of detecting one or more defects in a structure sample as claimed in claim 1 wherein, the method further comprises optimising one or more test parameters.

6. The method of detecting one or more defects in a structure sample as claimed in claim 5 wherein, the one or more test parameters comprise one or any combination of: temperature, pressure; etchant vapour density; material composition of the sacrificial layer; the duration of exposure to the vapour phase etchant; the resolution of the image of the thin film layer; and a process catalyst if required, resulting in additional parameters of catalyst vapour density and catalyst species.

7. The method of detecting one or more defects in a structure sample as claimed in claim 1 wherein, the vapour phase etchant comprises hydrogen fluoride and the sacrificial layer comprises silicon dioxide.

8. The method of detecting one or more defects in a structure sample as claimed in claim 7 wherein, the pressure within a test chamber is between vacuum, 0 Pa, and atmospheric pressure, ~100,000 Pa, and optionally between ~67 Pa to 6,700 Pa (~0.5 to 50 Torr).

9. The method of detecting one or more defects in a structure sample as claimed in claim 7 wherein, the temperature within the test chamber is between ~5 degrees Celsius to 100 degrees Celsius, and optionally between ~5 degrees Celsius to 45 degrees Celsius.

10. The method of detecting one or more defects in a structure sample as claimed in claim 7 wherein, water or alcohol is a catalyst.

11. The method of detecting one or more defects in a structure sample as claimed in claim 1 wherein, the vapour phase etchant comprises xenon difluoride and the sacrificial layer comprises germanium, molybdenum and or a silicon type material such as single crystal silicon, polycrystalline silicon and or amorphous silicon.

12. The method of detecting one or more defects in a structure sample as claimed in claim 11 wherein, a pressure within a test chamber is between ~67 Pa to 6,700 Pa (~0.5 to 50 Torr).

13. The method of detecting one or more defects in a structure sample as claimed in claim 11 wherein, a temperature of a test chamber is between ~15 degrees Celsius to 100 degrees Celsius.

14. The method of detecting one or more defects in a structure sample as claimed in claim 1 wherein, obtaining an image of the thin film layer comprises obtaining an image of a first surface of the thin film layer.

15. The method of detecting one or more defects in a structure sample as claimed in claim 1 wherein, obtaining an image of the thin film layer comprises utilising an imaging instrument such as: an optical microscope; a scanning electron microscope;
and or an atomic force microscope.

16. The method of detecting one or more defects in a structure sample as claimed in claim 15 wherein, the instrument resolution of the imaging instrument is factored into the optimisation of one or more test parameters.

17. The method of detecting one or more defects in a structure sample as claimed in claim 1 wherein, analysing the image comprises identifying any defects within the image of the first surface of the thin film layer.

18. The method of detecting one or more defects in a structure sample as claimed in claim 1 wherein, analysing the image comprises identifying any stress regions within the image of the first surface of the thin film layer.

19. The method of detecting one or more defects in a structure sample as claimed in claim 17 wherein, analysing the image may further comprise quantifying the size of any defects and or the size of any stress regions.

20. The method of detecting one or more defects in a structure sample as claimed in claim 19 wherein, analysing the image further comprises determining whether the size of a defect and or the size of a stress region is equal to or exceeds a critical or threshold size; or is smaller than a critical or threshold size.

21. The method of detecting one or more defects in a structure sample as claimed in claim 1 wherein, analysing the image may be performed by a computer program.

22. The method of detecting one or more defects in a structure sample as claimed in claim 1 wherein, analysing the image may further comprise performing image enhancement techniques.

23. The method of detecting one or more defects in a structure sample as claimed in claim 1 wherein, analysing the image is automated.

24. The method of detecting one or more defects in a structure sample as claimed in claim 1 wherein, the method comprises obtaining two or more images of the thin film layer.

25. The method of detecting one or more defects in a structure sample as claimed in claim 24 wherein, each image may be obtained using the same imaging instrument or alternatively using two or more imaging instruments, which may be of different quality, resolution and or type.

26. The method of detecting one or more defects in a structure sample as claimed in claim 24 wherein, the method comprises obtaining one or more images of the thin film layer before exposure to the vapour-phase etchant and one or more images after exposure to the vapour-phase etchant.

27. The method of detecting one or more defects in a structure sample as claimed in claim 24 wherein, the method further comprises analysing and comparing multiple images of the thin film layer.

28. The method of detecting one or more defects in a structure sample as claimed in claim 1 wherein, results of an analysis of the image or images is factored into an optimisation of one or more test parameters.

29. A testing system for detecting one or more defects in accordance with the method as claimed in claim 1, the testing system comprising a vapour phase etchant delivery system and a test chamber adapted or configured to receive a structure sample.

30. A quality control method for the manufacture of structure samples, the method comprising detecting one or more defects in a structure sample in accordance with the method as claimed in claim 1 and discarding or not discarding the structure sample accordingly.

31. The quality control method for the manufacture of structure samples as claimed in claim 30 wherein, discarding or not discarding the sample may comprise:
 discarding the structure sample if the size of a defect and or the size of a stress region is equal to or exceeds a critical or threshold; and or not discarding the structure sample if the size of a defect and or the size of a stress region is smaller than a critical or threshold size.

\* \* \* \* \*